United States Patent
Harvey

(10) Patent No.: US 6,867,121 B2
(45) Date of Patent: Mar. 15, 2005

(54) METHOD OF APPARATUS FOR INTERCONNECTING A RELATIVELY FINE PITCH CIRCUIT LAYER AND ADJACENT POWER PLANE(S) IN A LAMINATED CONSTRUCTION

(75) Inventor: Paul Marlan Harvey, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 12 days.

(21) Appl. No.: 10/346,285

(22) Filed: Jan. 16, 2003

(65) Prior Publication Data

US 2004/0140560 A1 Jul. 22, 2004

(51) Int. Cl.$^7$ ................ H01L 21/44; H01L 21/4763
(52) U.S. Cl. ............. 438/612; 438/613; 438/614; 438/616; 438/618; 438/622; 438/623; 438/637; 438/652; 438/666; 438/668; 257/737; 257/774
(58) Field of Search .................. 438/612–614, 438/616, 618, 622, 623, 637, 652, 666–668, FOR 343; 257/737, 758, 774

(56) References Cited

U.S. PATENT DOCUMENTS

| | | |
|---|---|---|
| 4,642,889 A | 2/1987 | Grabbe |
| 5,097,393 A | 3/1992 | Nelson et al. |
| 5,108,553 A | 4/1992 | Foster et al. |
| 5,252,857 A | 10/1993 | Kane et al. |
| 5,266,746 A | 11/1993 | Nishihara et al. |
| 5,357,403 A | 10/1994 | Haller et al. |
| 5,474,458 A | 12/1995 | Vafi et al. |
| 5,476,818 A | 12/1995 | Yanof et al. |
| 5,578,796 A | 11/1996 | Bhatt et al. |
| 5,639,696 A | 6/1997 | Liang et al. |
| 5,642,261 A | 6/1997 | Bond et al. |
| 5,736,679 A | 4/1998 | Kresge et al. |
| 5,814,393 A | 9/1998 | Miyaake et al. |
| 5,814,847 A | 9/1998 | Shihadeh et al. |
| 5,829,124 A | 11/1998 | Kresge et al. |
| 5,854,507 A | 12/1998 | Miremadi et al. |
| 5,861,666 A | 1/1999 | Bellaar |
| 5,891,753 A | 4/1999 | Akram |
| 5,990,546 A * | 11/1999 | Igarashi et al. ............. 257/700 |
| 6,034,332 A | 3/2000 | Moresco et al. |
| 6,050,832 A | 4/2000 | Lee et al. |

(List continued on next page.)

FOREIGN PATENT DOCUMENTS

JP          2001-156121          6/2001

OTHER PUBLICATIONS

Farber, A. S., "High–Capacitance Power Distribution Network"; *IBM Technical Disclosure Bulletin*; Mar. 1967; vol. 9, No. 10; p. 1266.

Cavaliere, J. R. et al., "High–Performance Single–Chip Module"; *IBM Technical Disclosure Bulletin*; Jun. 1981; vol. 24, No. 1A; pp. 46–48.

*Primary Examiner*—Nitin Parekh
(74) *Attorney, Agent, or Firm*—Carr LLP; Robert M. Carwell

(57) ABSTRACT

The present invention provides for a method of interconnecting a bumped circuit having relatively fine traces to an overlying conductive layer of a laminated circuit assembly. The overlying conductive layer is laminated with a suitable insulating adhesive over a bumped relatively fine pitch circuit layer. In the general vicinity of the desired power connection, a window substantially larger than the width of the bump is etched away from the conductive material of the trace of the outer conductive layer and the adhesive is plasma etched to expose the elevated portion of the desired bump of the bumped circuit. A conductive media such as conductive polymer or solder is then applied at the etched window of the overlying relatively coarse trace, which ensures an electrical connection between the exposed portion of the bump and the overlying trace.

16 Claims, 5 Drawing Sheets

| | | |
|---|---|---|
| 6,102,710 A | 8/2000 | Beilin et al. |
| 6,104,082 A | 8/2000 | Berlin et al. |
| 6,104,084 A | 8/2000 | Ishio et al. |
| 6,121,676 A | 9/2000 | Solberg |
| 6,137,164 A | 10/2000 | Yew et al. |
| 6,140,707 A | 10/2000 | Plepys et al. |
| 6,153,508 A | 11/2000 | Harvey |
| 6,175,158 B1 | 1/2001 | Degani et al. |
| 6,175,161 B1 | 1/2001 | Goetz et al. |
| 6,194,250 B1 | 2/2001 | Melton et al. |
| 6,222,265 B1 | 4/2001 | Akram et al. |
| 6,291,267 B1 | 9/2001 | Dore et al. |
| 6,297,551 B1 | 10/2001 | Dudderar et al. |
| 6,331,939 B1 | 12/2001 | Corisis et al. |
| 6,333,563 B1 | 12/2001 | Jackson et al. |
| 6,492,255 B2 * | 12/2002 | Enomoto et al. ... 438/614 |

* cited by examiner

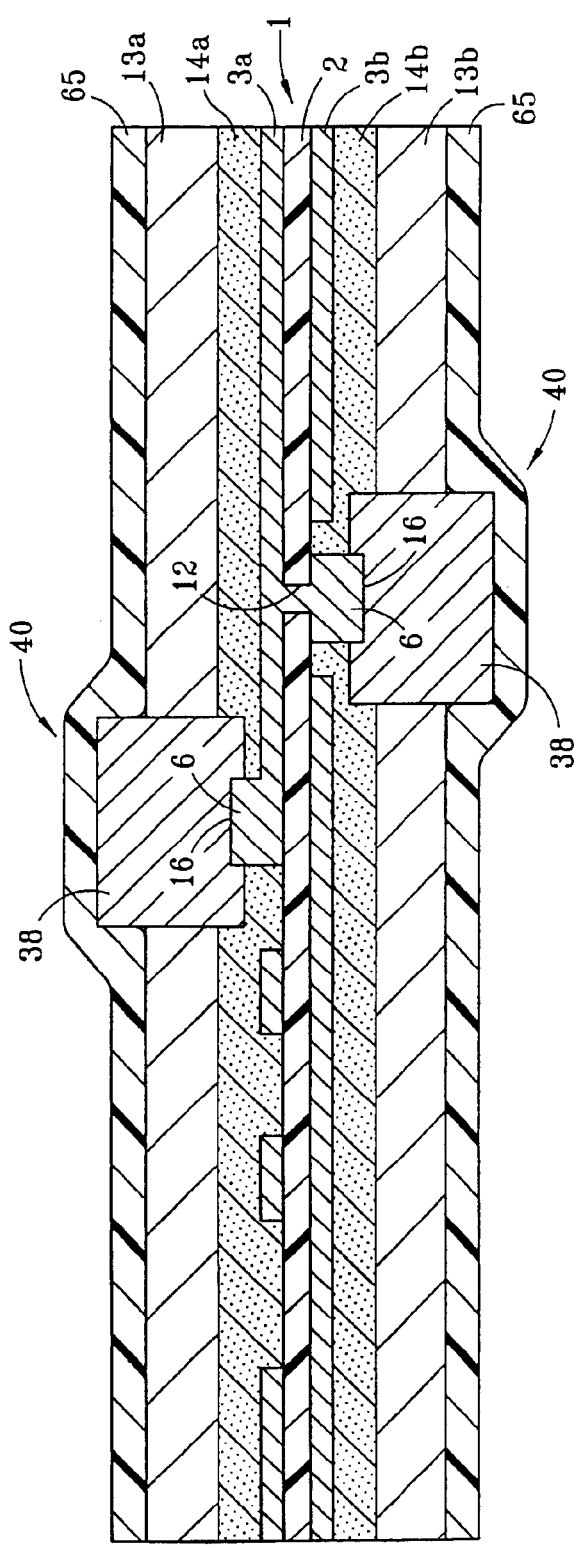
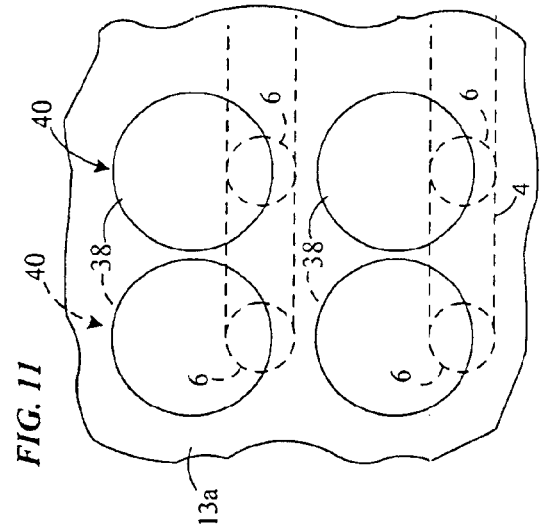
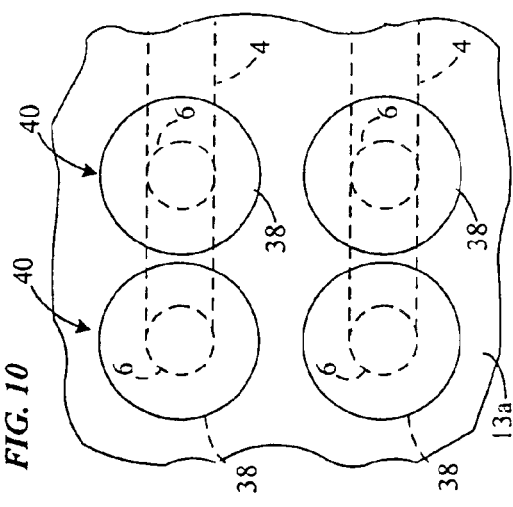
FIG. 9
FIG. 11
FIG. 10

METHOD OF APPARATUS FOR INTERCONNECTING A RELATIVELY FINE PITCH CIRCUIT LAYER AND ADJACENT POWER PLANE(S) IN A LAMINATED CONSTRUCTION

CROSS-REFERENCED APPLICATIONS

This application relates to co-pending U.S. patent applications entitled "Flex-Based IC Package Construction Employing a Balanced Lamination" application Ser. No. 10/346,286 and "Ball Grid Array Package Construction With Raised Solder Ball Pads application Ser. No. 10/346,277 filed concurrently herewith, the contents of which are hereby incorporated by reference.

BACKGROUND OF THE INVENTION

1. Field of the Invention

This invention relates generally to the field of integrated circuit packaging.

2. Description of the Related Art

Laminated constructions of relatively fine pitch circuit layers and power planes are used in many integrated circuit packaging applications. Typically, features in relatively fine pitch circuit layers are much finer than features in power planes. Interconnections between relatively fine pitch circuit layers and attendant power planes are typically done by mechanically drilling through the construction after the relatively fine pitch circuit layers and power planes have been laminated together, and then filling the drilled hole with conductive material to make a via. In this approach, the tolerance of the mechanical drilling process and lamination lay-up must be accommodated on all layers of the laminated construction. This method requires relatively large capture pads and/or keep-out zones on all relatively fine pitch circuit layers in the construction at the target drill location, to ensure that the drilled hole interconnects with the capture pad. A large capture pad is highly undesirable in many circuit packaging applications where power distribution to and from the power planes at precise locations on the relatively fine pitch circuit layers is required. For example, present circuit technology can produce 25 micron lines and spaces on high density relatively fine pitch circuit layers. However, mechanical methods of lay-up, lamination, drilling, etc., often require 300 to 600 microns of tolerance build-up at the interconnect locations. The capture pads must accommodate not only a large drill hole, but also account for tolerance build-up due to drill wander, misregistration of the relatively fine pitch circuit layers and power planes, and thermal and mechanical dimensional instability of the materials, especially during high temperature and pressure lamination. These large capture pads in the circuit design add significant electrical parasitics (inductance, resistance and capacitance) to the design, which can significantly degrade the electrical performance of the design. These electrical parasitics can be quite deleterious to the package performance because currents in excess of 50 amps can be switched at sub-nanosecond speeds and extremely low inductances are required to minimize the noise associated with this current switching activity.

Others have recognized the problem of tolerance build-up in the laminate structure. A widely practiced method for addressing this problem is to use more sophisticated and precise methods of drilling interconnects, such as laser drilling coupled with precision optical benches or stages. Laser drilling is typically used in situations where precision is required in the interconnection between power planes and relatively fine pitch circuit layers. However, this method is still subject to the dimensional instability of the dielectric materials, lamination lay-up tolerances, and the positioning of the laser with respect to the fine pitch circuit features. Also, these methods are significantly more expensive than mechanical drilling and merely provide a smaller drilled hole in the laminate structure to form the interconnect, but do not address the intrinsic tolerance build-up inherent in the lamination lay-up, registration, material dimensional instability, etc. Thus, the laser drilling technique results in much more expensive laminate structures and only minimizes a portion of the total tolerance build-up.

In another approach to the problem of precision interconnection of a relatively fine pitch circuit trace to an outer conductive layer or power plane, sequential processing has been proposed to ameliorate much of the tolerance build-up in the laminate structure. However, sequential processing requires that each layer be formed on the previous layer. In brief, this approach leads to yield degradation because the yield of the final structure is the cumulative yield of each individual layer. In advanced circuit design, the yield of each layer may be low; therefore, the cumulative yield of multiple layers may be impractically low. The cost of this type of processing, therefore, is also high.

OBJECTS OF THE INVENTION

Accordingly, it is an object of the present invention to avoid the foregoing disadvantages of the prior art.

In particular, it is an object of the present invention to provide a method of interconnecting an outer conductive layer to a desired interconnection point on a trace of a relatively fine pitch circuit layer that does not require precision drilling or highly precise registration between the relatively fine pitch circuit layer and the outer conductive layer.

It is another object of the invention to provide a method for interconnecting an outer conductive layer to a desired interconnection point on a trace of a relatively fine pitch circuit layer that does not require large capture pads on the relatively fine pitch circuit layer.

It is another object of the invention to provide a method of interconnecting an outer conductive layer to a desired interconnection point on a trace of a relatively fine pitch circuit layer trace that minimizes electrical parasitics.

SUMMARY OF THE INVENTION

In accordance with a preferred embodiment of the present invention, a method of electrically interconnecting a bump of a bumped relatively fine pitch circuit layer trace to a portion of an outer conductive layer separated from the fine pitch circuit layer trace by an insulating layer is provided, comprising the steps of positioning a portion of the outer conductive layer to be connected generally over a bumped relatively fine pitch circuit layer, the bumped relatively fine pitch circuit layer having at least one bump having a center at an x-y location relative to the outer conductive layer. The bump has an approximate width orthogonal to the z-dimension, removing conductive material from the portion of the outer conductive layer generally over the bump to make an opening in the conductive layer trace, the opening having a width substantially greater than the width of the bump, the opening being disposed generally above the x-y location of the bump. Sufficient insulating material is removed from the insulating layer within the opening and over the bump to expose at least a top portion of the bump and at least a portion of the opening is filled with sufficient conductive paste or solder to electrically interconnect the bump to the portion of the outer conductive layer.

In accordance with another preferred embodiment of the present invention, a method of electrically interconnecting a bump of a bumped relatively fine pitch circuit layer to a portion of an outer conductive layer is provided comprising the steps of placing an insulating layer over a bumped relatively fine pitch circuit layer having at least one bump having a center at an x-y location and protruding in a z-dimension, the bump having an approximate width orthogonal to the z-dimension and overlaying onto the insulating layer an outer conductive layer with at least a portion of the outer conductive layer to be connected disposed generally over the x-y location of the bump. In other steps, photoresist is applied to the outer conductive layer, the photoresist is imaged to create an unimaged region of the outer conductive layer having a width substantially greater than the width of the bump, the unimaged region being disposed generally above the x-y location of the bump, and unimaged photoresist is from the unimaged region of the outer conductive layer. Material from the outer conductive layer at the unimaged region to make an opening in a portion of the conductive layer trace to expose the insulating layer below the opening and a portion of the insulating layer immediately below the opening is removed to define a cavity in the insulating layer exposing a top portion of the bump within the cavity. Then, at least a portion of the opening and the cavity where the bump is located is filled with sufficient conductive paste or solder to electrically interconnect the bump to the portion of the outer conductive layer.

In accordance with another preferred embodiment of the present invention, an electrical interconnection between a bump of a bumped relatively fine pitch circuit layer trace and a portion of an outer conductive layer is provided. The electrical interconnection comprises an insulating layer disposed over a bumped relatively fine pitch circuit layer trace, the trace having at least one bump having a center at an x-y location, the insulating layer having a cavity formed therein at the location of the bump so that a top portion of the bump protrudes in a z-dimension through the insulating layer, the bump having an approximate width orthogonal to the z-dimension. The preferred embodiment further comprises an outer conductive layer overlaying the insulating layer with at least a portion of the outer conductive layer to be connected disposed generally over the x-y location of the bump and has an opening formed in the portion of the outer conductive layer to be connected, the opening having a width substantially greater than the width of the bump defined therein, the opening being disposed generally above the x-y location of the bump. This preferred embodiment further comprises sufficient conductive paste or solder disposed within the opening to electrically interconnect the bump to the portion of the outer conductive layer.

BRIEF DESCRIPTION OF THE DRAWINGS

FIG. 9 is a cross-sectional view through the bumped circuit and outer conductive layers on the upper and lower sides of the bumped circuit depicted in FIG. 8, showing the interconnection and an optional subsequent step wherein a protective nonconductive coating is applied to each outer conductive layer and over the conductive paste or solder;

FIG. 10 is a plan view of the x-y plane, viewed from the bottom of the interconnection depicted in FIG. 8, with perfect alignment; and FIG. 11 is a plan view of the x-y plane, viewed from the bottom of the interconnection depicted in FIG. 8, showing an example of the interconnection with a large amount of misalignment between the opening and the intended interconnection point.

DETAILED DESCRIPTION

The foregoing and other objects, features and advantages of the invention will be apparent from the following more particular description of a preferred embodiment of the invention, as illustrated in the accompanying drawings wherein like reference numbers represent like parts.

Figure 1:
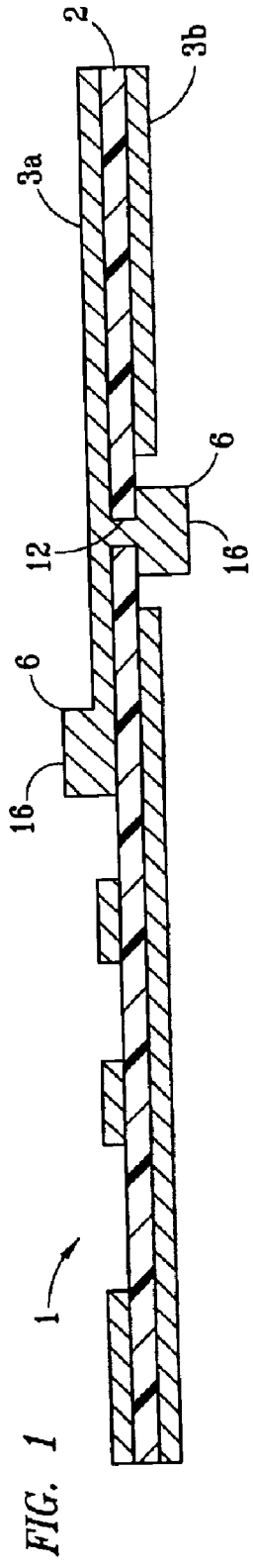
FIG. 1 is a cross-sectional view through a two metal layer (2ML) bumped circuit preferred for use in the present invention, showing one exemplary raised bump on each relatively fine pitch circuit layer.

Turning first to FIG. 1, a cross-sectional view through a relatively fine bumped circuit assembly 1 preferred for use in the present invention is depicted. Preferably, the bumped circuit assembly 1 is a two metal layer (2ML) flex type, but this is not required, and a bump printed circuit board may be used. FIG. 1 depicts one representative raised bump 6 on each relatively fine pitch circuit layer 3a and 3b, but in practice many more bumps 6 would be disposed on the circuit layers. By "relatively fine" is meant that the average pitch of the traces is generally smaller than the average pitch of the trace or traces to be connected on the outer conductive layers 13a or 13b, shown in FIG. 2. In advanced circuits, the pitch distance may be as little as 25 microns. Although only one cross-section is shown cutting through one plane of the bumped circuit through the bumps, it is to be understood that the bumps 6 are preferably generally symmetrical; so that the width of the bump along the longitudinal orientation (the "x-dimension") is preferably approximately the same as for the width of the bump in the "y-dimension" (for example, into the plane of the paper), although this is not required. In a preferred embodiment of the invention, the width of the bump 6 is between about 10 and 100 microns, with between about 25 and 50 microns being preferred. It should be noted, however, that the width of the bump 6 can be as small as desired, the lower limit being limited only by circuit manufacturing technology.

It should also be noted that, although only one bump 6 is depicted on each side of the 2ML circuit 1 in FIG. 1, the 2ML circuit typically has a plurality of bumps on each side, similar in size, shape and configuration to the bumps depicted in FIG. 1. Each of these bumps is spaced apart from other bumps. In advanced circuits, the spacing between the bumps may be in the range of 300 microns or less.

Figure 2:
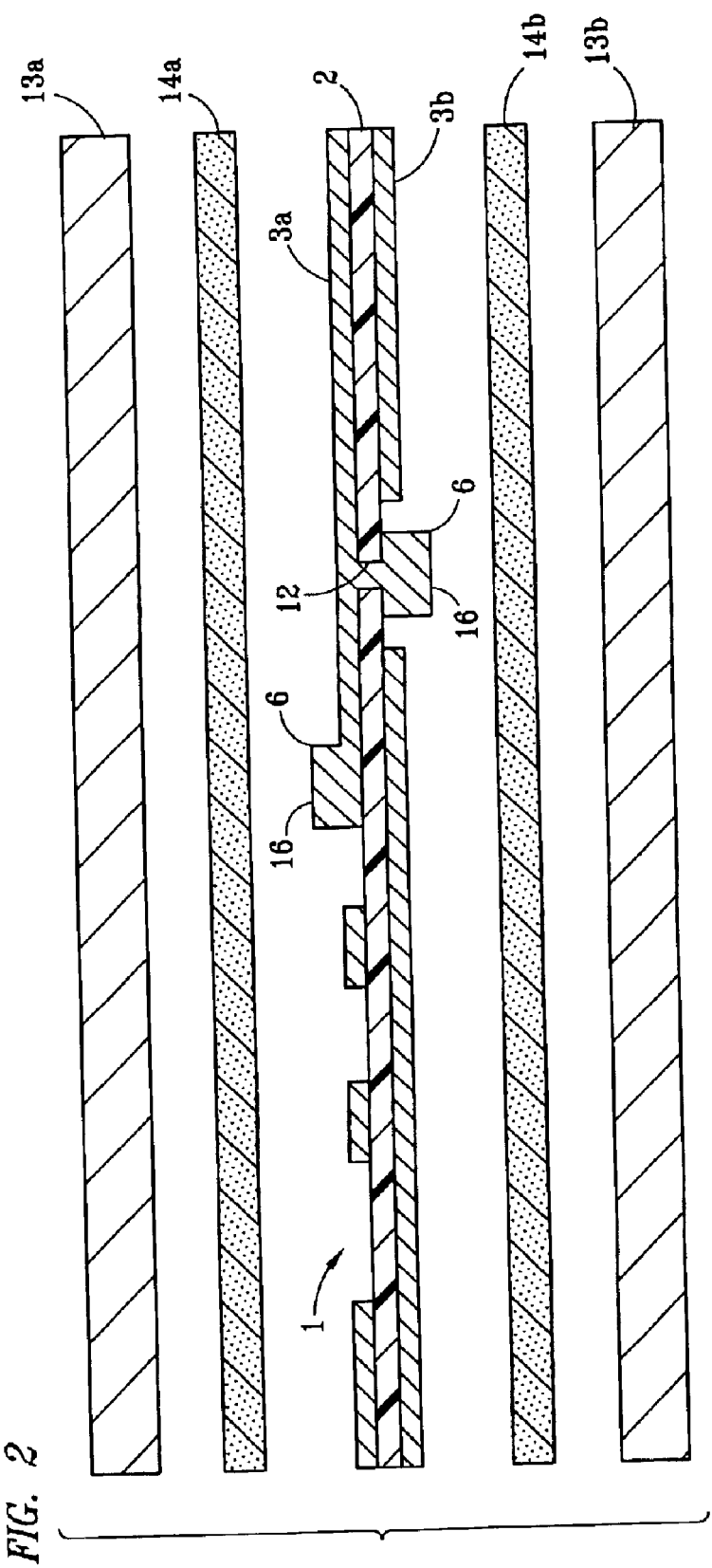
FIG. 2 is a cross-sectional view through the bumped circuit depicted in FIG. 1, with outer conductive layers on the upper and lower sides of the bumped circuit, showing a first step in the construction of a laminated circuit used in the present invention.
Figure 3:
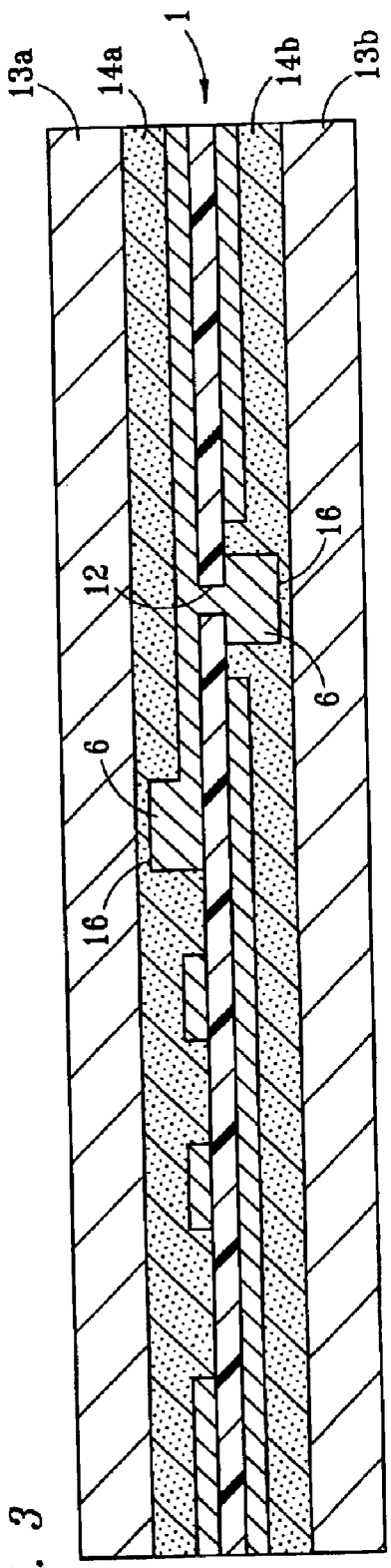
FIG. 3 is a cross-sectional view through the bumped circuit and outer conductive layers on the upper and lower sides of the bumped circuit depicted in FIG. 2, showing a subsequent lamination step in the construction of a laminated circuit used in the present invention.

Turning now to FIG. 2, insulating adhesive layers 14a and 14b are applied between the bumped circuit layer 3a and outer conductive layer 13a, and between the bumped circuit layer 3b and outer conductive layer 13b. As depicted in FIG. 3, after positioning the outer conductive layers so that a portion of the outer conductive layer to be connected is generally over the location of the desired bump to be interconnected, the outer layers are laminated onto the bumped circuit by the medium of the insulating adhesive layers 14a and 14b. It should be noted that the outer conductive layers can be laminated onto the bumped circuit simultaneously or sequentially to each other.

Figure 4:
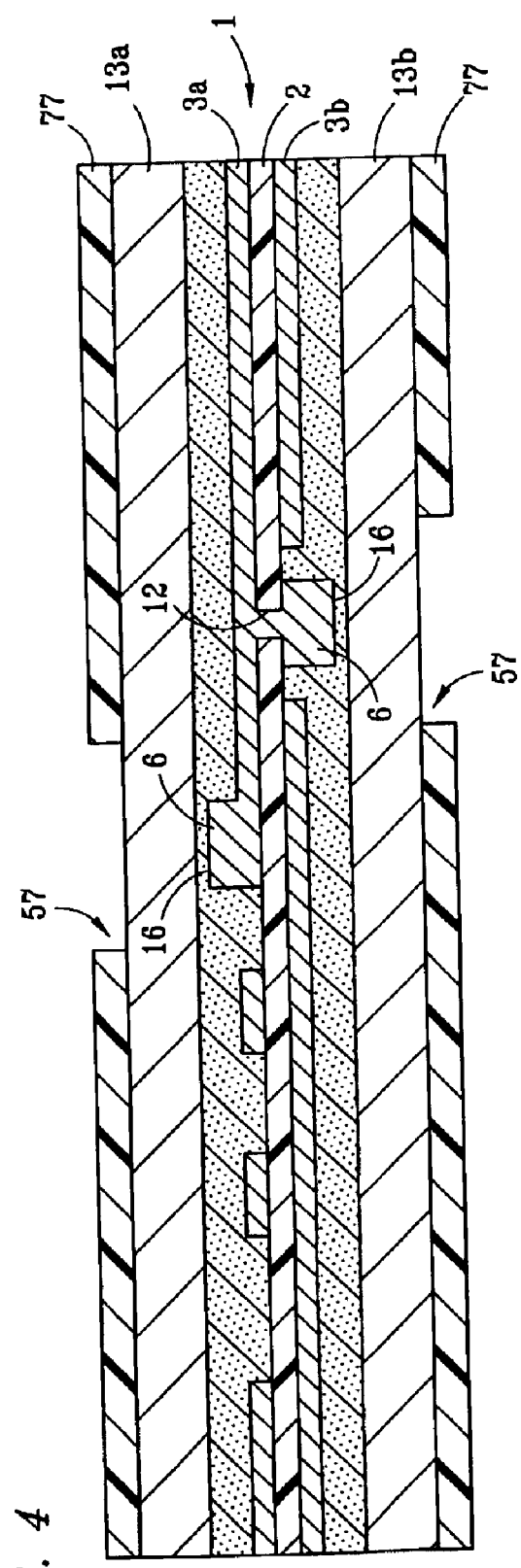
FIG. 4 is a cross-sectional view through the bumped circuit and outer conductive layers on the upper and lower sides of the bumped circuit depicted in FIG. 3, showing the steps of photoresist application, imaging and unimaged photoresist removal in the construction of the interconnection of the present invention.

Turning now to FIG. 4, a cross-sectional view through the bumped circuit and overlying circuit layers on the upper and lower sides of the bumped circuit is depicted, showing several steps in the manufacture. First, a photoresist 77 is applied in a well-known manner. Then, the photoresist 77 is imaged at portions other than an unimaged area, where openings 37 are to be etched into outer conductive layers 13a and 13b. Also at this time, if desired, the outer conductive layers 13a and 13b are imaged in the pattern required to create circuit traces chip windows and/or other features in the conductive layer at desired locations.

Third, the unimaged areas of photoresist 77 are removed creating an exposed area 57 of outer conductive layers generally over the location of the bump 6 to be interconnected. The width of the exposed area 57 is substantially greater than the width of the bump 6, preferably at least two times the width of the bump 6, which minimizes the need for highly precise positioning exposed area 57 over the bump. It should be noted that the foregoing steps can be accomplished simultaneously for the upper and lower outer conductive layer, or sequentially, if desired.

Figure 5:
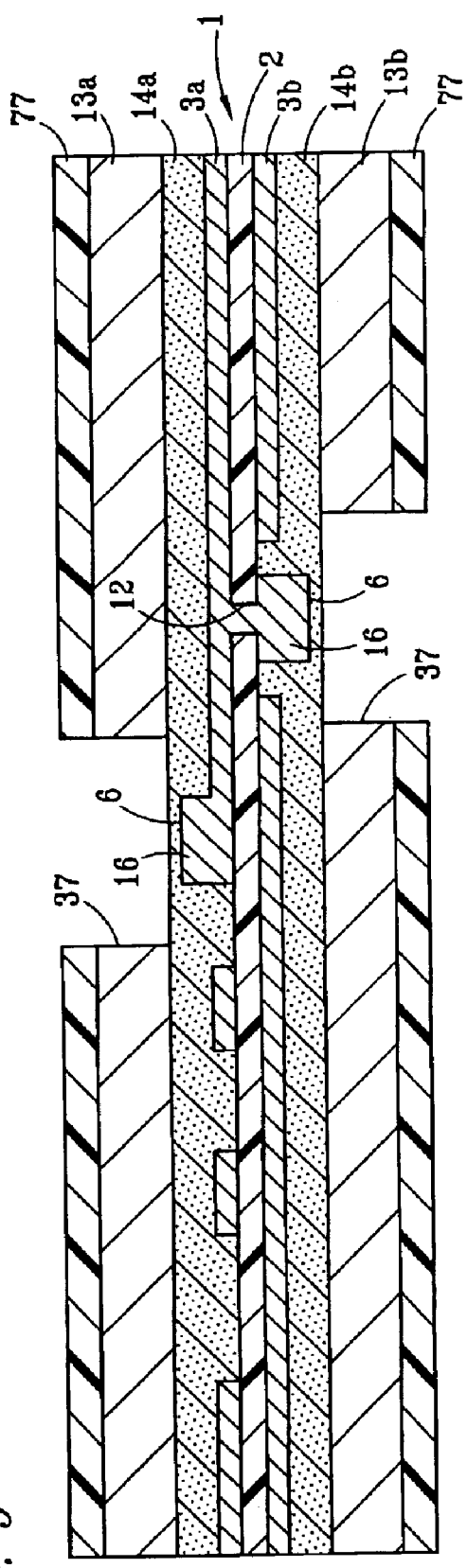
FIG. 5 is a cross-sectional view through the bumped circuit and outer conductive layers on the upper and lower sides of the bumped circuit depicted in FIG. 4, showing a subsequent step wherein respective openings are etched in the respective outer conductive layers above the location of the bump on each side of the bumped circuit.

Turning now to FIG. 5, in this step, the now exposed, unimaged areas 57 of the respective outer conductive layers 13a and 13b are etched away, to form openings 37 in them, leaving the adhesive layers 14a and 14b. It should be noted the foregoing steps can be accomplished simultaneously for the upper and lower conductive layers 13a and 13b, or sequentially, if desired.

Figure 6:
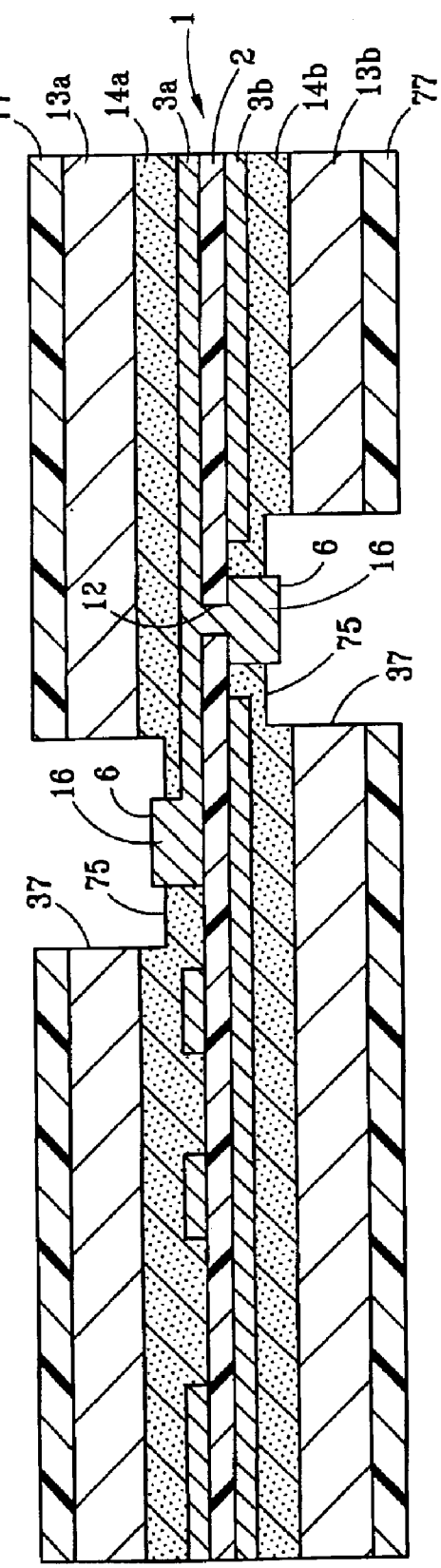
FIG. 6 is a cross-sectional view through the bumped circuit and outer conductive layers on the upper and lower sides of the bumped circuit depicted in FIG. 5, showing a subsequent step wherein the adhesive layers below the respective openings are etched away to expose the tops of the respective bumps.

Turning now to FIG. 6, after the openings 37 have been etched away, the adhesive layers 14a and 14b are plasma etched away at the location of the openings 37, forming a cavity 75 in the adhesive layers 14a and 14b at the opening 37, exposing the tops 16 of the circuit bumps 6 on each respective side. It should be noted that the foregoing steps can be accomplished simultaneously for the lower and upper outer conductive layers, or sequentially, if desired.

Figure 7:
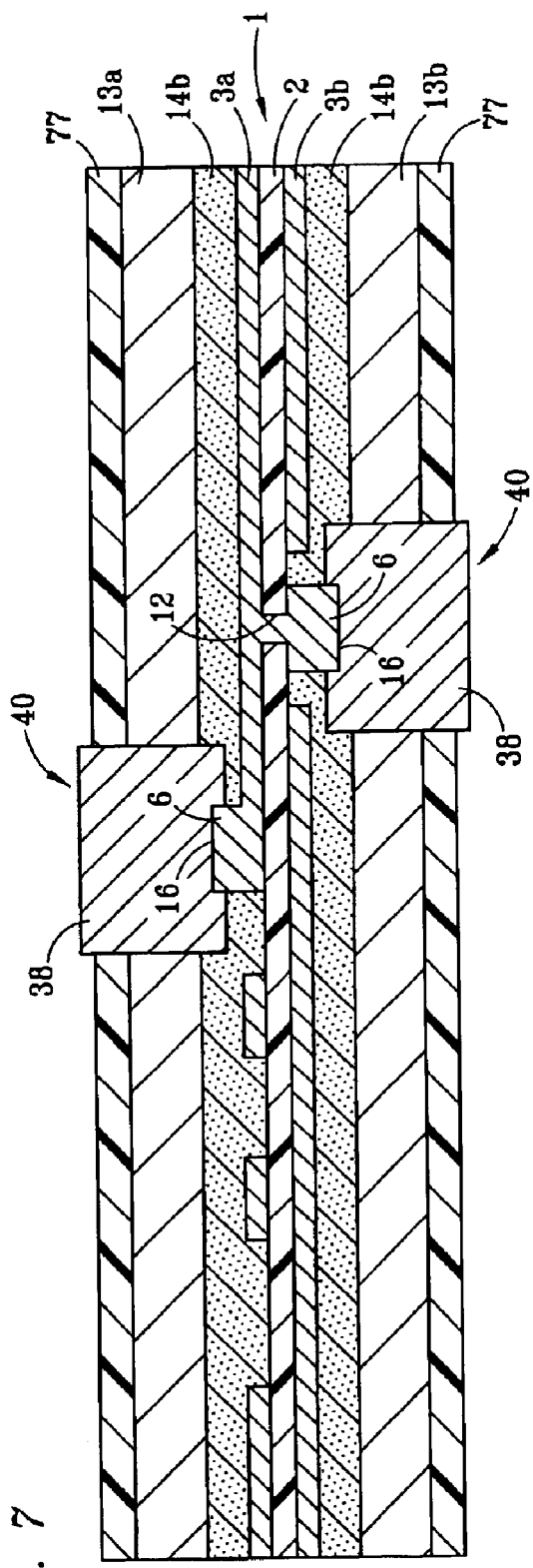
FIG. 7 is a cross-sectional view through the bumped circuit and outer conductive layers on the upper and lower sides of the bumped circuit depicted in FIG. 6, showing a subsequent step wherein a conductive paste or solder is deposited in the window to interconnect the respective outer conductive layers to their respective bumps, to create interconnections in accordance with a preferred embodiment of the present invention.

FIG. 7 shows, in a cross-sectional view through the bumped circuit assembly 1, a subsequent step wherein a conductive paste or solder 38 is deposited in the opening 37 to interconnect the respective outer conductive layers 13a and 13b to their respective bumps 6, forming the preferred form of the interconnect 40 of the present invention.

Figure 8:
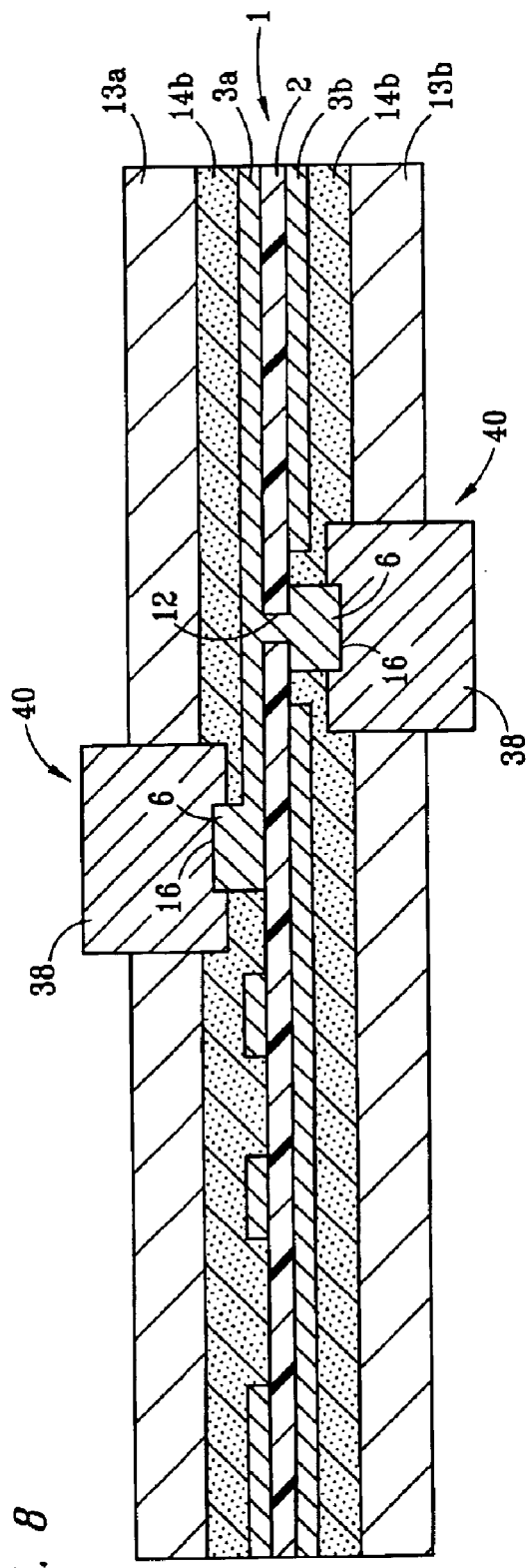
FIG. 8 is a cross-sectional view through the bumped circuit and outer conductive layers on the upper and lower sides of the bumped circuit depicted in FIG. 7, showing the interconnection and a subsequent step wherein the photoresist layer is removed.

Preferably all parts of the bump 6 will be positioned below the opening 37. However, all that is required is that at least a portion of the bump 6 be positioned generally below a part of the opening 37, sufficiently for the conductive paste or solder to electrically connect the bump. For example, FIG. 11 shows a plan view of the cross-section area of the interconnection 40 depicted in FIG. 8, with the bump 6 on a trace 4 of bumped circuit layer 3b relatively centered in the window as would be the case with ideal alignment. For comparison, FIG. 11 shows a plan view of the cross-section area of the interconnection 40 as would be the case if the bump 6 on the trace 4 was made considerably off-center in the opening 37, due to unavoidable misalignment. As can be seen, even though the bump 6 is considerably misaligned, it is still sufficiently electrically connected to the outer conductive layer 13b by means of the solder or conductive paste 38.

FIG. 9 depicts an optional subsequent step wherein a protective nonconductive coating 65 is applied over each outer conductive layer 13a and 13b and over the conductive paste or solder 38.

The present invention proposes a cost effective, novel interconnect that enables connection to outer conductive layers, such as power planes or planes at precise locations on a relatively fine pitch circuit layer, without the high-precision drilling required in the prior art, thus eliminating the requirement for a large capture pad on the relatively fine pitch circuit layer and the attendant, undesirable capacitance and inductance.

The method proposed in this disclosure has the potential to dramatically reduce or eliminate the problem of tolerance build-up in laminate structures. This approach is novel and, in fact, counter-intuitive because the very region of the desired interconnect on the overlying conductive layer is intentionally removed in the initial etching step to create a window in the conductive material. This facilitates plasma etching to expose the elevated portion of bump of the bumped circuit and subsequent application of a conductive media to complete the electrical connection. Because the opening has a width substantially greater than the width of the bump, positioning the opening so that at least a portion of the bump is disposed within the borders of the opening can be accomplished with a series of fabrication steps that do not require precision registration. This can be extremely valuable in designs, such as integrated circuit packaging, where precise locations for power delivery can facilitate significantly higher switching speeds and/or operating frequencies.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A method of electrically interconnecting a bump of a bumped fine pitch circuit layer trace to a portion of an outer conductive layer separated from the bumped fine pitch circuit layer trace by an insulating layer, comprising the steps of:

positioning a portion of the outer conductive layer to be connected generally over the bumped fine pitch circuit layer, the bumped fine pitch circuit layer having at least one bump having a center at an x-y location relative to the outer conductive layer, the bump having an approximate width orthogonal to the z-dimension, removing conductive material from the portion of the outer conductive layer generally over the bump to make an opening in the conductive layer, the opening having a width substantially greater than the width of the bump, the opening being disposed generally above the x-y location of the bump;

removing sufficient insulating material from the insulating layer within the opening and over the bump to expose at least a portion of a top of the bump; and filling at least a portion of the opening with sufficient conductive paste or solder to electrically interconnect the bump to the portion of the outer conductive layer.

2. The method defined in claim 1, wherein the fine pitch circuit layer is a two metal layer (2ML) flex circuit.

3. The method defined in claim 1, wherein the fine pitch circuit layer is printed circuit board.

4. The method defined in claim 1, further comprising placing a solder mask over the conductive paste or solder.

5. The method defined in claim 1, wherein the spacing between the bumps is less than about 300 microns.

6. The method defined in claim 1, wherein the opening formed in the conductive layer to be connected is at least about two times the width of the bump.

7. The method defined in claim 1, wherein the width of the bump is between about 10 and 100 microns.

8. The method defined in claim 2, wherein the width of the bump is between about 25 and 50 microns.

9. A method of electrically interconnecting a bump of a bumped fine pitch circuit layer to a portion of an outer conductive layer, comprising the steps of:

placing an insulating layer over a bumped fine pitch circuit layer having at least one bump having a center at an x-y location and protruding in a z-dimension, the bump having an approximate width orthogonal to the z-dimension;

overlaying onto the insulating layer an outer conductive layer with at least a portion of the outer conductive layer to be connected disposed generally over the x-y location of the bump;

applying a photoresist to the outer conductive layer;

imaging the photoresist to create an unimaged region of the outer conductive layer having a width substantially greater than the width of the bump, the unimaged region being disposed generally above the x-y location of the bump;

removing unimaged photoresist from the unimaged region of the outer conductive layer;

removing material from the outer conductive layer at the unimaged region to make an opening in a portion of the conductive layer to expose the insulating layer below the opening;

removing a portion of the insulating layer immediately below opening to define a cavity in the insulating layer exposing at least a portion of a top of the bump within the cavity; and filling at least a portion of the opening and the cavity where the bump is located with a conductive paste or solder to electrically interconnect the bump to the portion of the outer conductive layer.

10. The method defined in claim 9, wherein the fine pitch circuit layer is a two metal layer (2ML) flex circuit.

11. The method defined in claim 9, wherein the fine itch circuit layer is printed circuit board.

12. The method defined in claim 9, further comprising placing a solder mask over the conductive paste or solder.

13. The method defined in claim 9, wherein the spacing between the bumps is less than about 300 microns.

14. The method defined in claim 9, wherein the opening formed in the conductive layer to be connected is at least about two times the width of the bump.

15. The method defined in claim 9, wherein the width of the bump is between about 10 and 100 microns.

16. The method defined in claim 9, wherein the width of the bump is between about 25 and 50 microns.

* * * * *

UNITED STATES PATENT AND TRADEMARK OFFICE
CERTIFICATE OF CORRECTION

PATENT NO. : 6,867,121 B2
DATED : March 15, 2005
INVENTOR(S) : Paul Marian Harvey It is certified that error appears in the above-identified patent and that said Letters Patent is hereby corrected as shown below:

<u>Title page,</u>
Item [54], Title, after "METHOD" and before "APPARATUS", delete "of" and insert -- AND --

<u>Column 8,</u>
Line 30, delete "itch" and insert -- pitch --

Signed and Sealed this

Seventeenth Day of May, 2005

JON W. DUDAS
*Director of the United States Patent and Trademark Office*